(12) United States Patent
Kaji et al.

(10) Patent No.: US 6,749,706 B2
(45) Date of Patent: Jun. 15, 2004

(54) METHOD OF MANUFACTURING MONOLITHIC PIEZOELECTRIC CERAMIC DEVICE

(75) Inventors: Toshiaki Kaji, Yokaichi (JP); Yoshimasa Yoshino, Shiga-ken (JP); Suetake Omiya, Yokaichi (JP); Koichi Yamada, Yokaichi (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/327,039

(22) Filed: Dec. 24, 2002

(65) Prior Publication Data
US 2003/0196740 A1 Oct. 23, 2003

(30) Foreign Application Priority Data

Dec. 26, 2001 (JP) .................... 2001-394060
Dec. 26, 2001 (JP) .................... 2001-394061

(51) Int. Cl.$^7$ ................ H01L 41/22; B32R 31/26; H04R 17/00
(52) U.S. Cl. .............. 156/89.17; 156/89.12; 156/89.14; 264/618; 264/674; 29/25.35
(58) Field of Search ............. 156/89.12, 89.14, 156/89.17; 264/614, 618, 674; 29/25.35; 310/358, 364

(56) References Cited

U.S. PATENT DOCUMENTS

| | | | | |
|---|---|---|---|---|
| 5,759,480 A | * | 6/1998 | Hennings et al. | 264/620 |
| 5,935,485 A | * | 8/1999 | Tani et al. | 252/62.9 PZ |
| 6,045,893 A | * | 4/2000 | Fukushima et al. | 428/209 |
| 6,221,271 B1 | * | 4/2001 | Watanabe et al. | 252/62.9 PZ |
| 2003/0163908 A1 | * | 9/2003 | Kaji et al. | 29/25.35 |

FOREIGN PATENT DOCUMENTS

| | | |
|---|---|---|
| JP | 2-74566 | 3/1990 |
| JP | 4-357164 | 12/1992 |
| JP | 10-95665 | 4/1998 |
| JP | 11-163433 | 6/1999 |

* cited by examiner

Primary Examiner—Melvin C. Mayes
(74) Attorney, Agent, or Firm—Dickstein, Shapiro, Morin & Oshinsky, LLP.

(57) ABSTRACT

A method of manufacturing a piezoelectric ceramic device having excellent piezoelectric characteristics and high reliability is described. The method includes the steps of coating conductive paste containing Ag as a main component on each of a plurality of ceramic green sheets each containing a piezoelectric ceramic material, laminating the plurality of ceramic green sheets to form a laminate, and burning the laminate under an atmospheric condition in which the oxygen concentrations in a heating process and a retention process are about 21% by volume or more, and the oxygen concentration in a cooling process is about 0.05% by volume to 3% by volume.

19 Claims, 5 Drawing Sheets

METHOD OF MANUFACTURING MONOLITHIC PIEZOELECTRIC CERAMIC DEVICE

BACKGROUND OF THE INVENTION

1. Field of the Invention

The present invention relates to a method of manufacturing a piezoelectric ceramic device used for a piezoelectric resonator, a piezoelectric actuator, a piezoelectric filter, a piezoelectric buzzer, a piezoelectric transformer, etc. Particularly, the present invention relates to a method of manufacturing a piezoelectric ceramic device comprising internal electrodes each comprising an alloy composed of Ag as a main component.

2. Description of the Related Art

It is conventionally known that burning under optimum conditions is necessary and essential for a piezoelectric ceramic device used for a piezoelectric resonator, a piezoelectric actuator, a piezoelectric filter, a piezoelectric buzzer, a piezoelectric transformer, etc. in order to have no structural defects, high reliability and excellent part characteristics according to a desired application. Therefore, various attempts to achieve this result have been made so far.

For example, Japanese Unexamined Patent Application Publication No. 2-74566 discloses a burning process under conditions in which the oxygen concentration in a furnace atmosphere is kept at 50% by volume or more in a step of heating to a burning temperature, and the oxygen concentration of the furnace atmosphere in a step of retention at the burning temperature is ½ of that in the heating process or 10% by volume. In the heating process under the condition of a high oxygen atmosphere having an oxygen concentration of 50% by volume or more in this process, the oxygen concentration in the ceramic closed pores formed in the heating process is increased. In the next step of retention at the burning temperature, the oxygen concentration of the furnace atmosphere is ½ of that in the heating process or 10% by volume, and thus a difference between the oxygen concentrations in the ceramic closed pores and in air is increased to increase the oxygen diffusion rate, thereby permitting dense sintering of piezoelectric ceramic composed of an oxide with high productivity.

Also, Japanese Unexamined Patent Application Publication Nos. 4-357164 and 10-95665 disclose a total burning profile comprising a burning process under atmospheric conditions in which the oxygen concentration is 80% by volume or more. This process can produce a piezoelectric ceramic device, particularly a piezoelectric resonator, which has compactness and high reliability, and which comprises a ceramic sintered body inhibited from producing pores and structural defects.

Furthermore, a total-burning profile comprising a burning process in air, i.e., in an atmosphere of an oxygen concentration of about 21% by volume, regardless of the type of the internal electrodes used is known. This process is generally used for various piezoelectric ceramic parts.

However, the above-described conventional burning processes used for piezoelectric ceramic devices have a problem in that when a green laminate comprising internal electrodes comprising an alloy composed of Ag as a main component is burned, the Ag contained in the internal electrodes is taken into ceramic grains in the piezoelectric ceramic layer, deteriorating piezoelectric characteristics.

SUMMARY OF THE INVENTION

Accordingly, it is an object of the present invention to provide a method of manufacturing a monolithic piezoelectric ceramic device exhibiting excellent piezoelectric characteristics, and high reliability.

In order to achieve the object of the present invention, a method of manufacturing a monolithic piezoelectric ceramic device comprises the steps of coating a conductive paste containing an alloy composed of Ag as a main component on a plurality of ceramic green sheets each containing a piezoelectric ceramic material, laminating the plurality of ceramic green sheets to form a laminate, and burning the laminate in an atmosphere in which the oxygen concentrations in the heating process and retention process are about 21% by volume or more, and the oxygen concentration in a cooling process is about 0.05% by volume to about 3% by volume.

The reason for limiting the oxygen concentration in the cooling process during burning to about 0.05% to 3% by volume is as follows.

When burning in an atmosphere containing 0.05% by volume to 3% by volume of oxygen, Ag which dissolved in ceramic grains in the heating process and retention process precipitates at the grain boundaries due to a decrease in the oxygen concentration in the cooling process to cause a state close to the piezoelectric ceramic state before dissolution, and thus the Ag functions to prevent deterioration in piezoelectric characteristics and reliability, thereby improving the piezoelectric characteristics and reliability.

However, when the oxygen concentration is over about 3% by volume, the effect of precipitating Ag, which has been taken in the ceramic grains as described above, in the ceramic grain boundaries is not sufficiently exhibited, thereby failing to improve the piezoelectric characteristics and reliability.

On the other hand, with an oxygen concentration of less than about 0.05% by volume, precipitation of a heterogeneous phase is observed on the piezoelectric ceramic surfaces, and the heterogeneous phase inhibits the piezoelectric characteristics and reliability, thereby failing to improve the piezoelectric characteristics and reliability.

The reason for limiting the oxygen concentrations in the heating process and retention process during burning to about 21% by volume or more is as follows.

With an oxygen concentration or less than about 21% by volume, sufficient sinterability cannot be obtained, which causes deterioration in characteristics.

In the heating process and retention process, for example, a lead zirconate titanate (PZT)-type compound is burned in air having an oxygen content of about 21% by volume, or an atmosphere having an oxygen content of about 21% by volume or more. The burning temperature in the maximum temperature region is set to a temperature at which the laminate is completely sintered in these atmospheric conditions, and specifically, a temperature at which the pack density of the laminated sintered body is 99% or more of the theoretical density. The retention time in the maximum temperature region is also set based on the same idea as the burning temperature.

With the lead zirconate titanate (PZT)-type compound, for example, each of the heating rate and the cooling rate is set in the range of about 1 to 110° C./min, and the retention time in the maximum temperature region is set in the range of about 1 to 10 hours.

However, the burning conditions are not limited to the above conditions, and the optimum burning temperature, heating rate, retention time and cooling rate may be selected according to the type (composition system) of the piezoelectric ceramic material.

Besides the lead zirconate titanate (PZT)-type compound, the piezoelectric ceramic material contained in the ceramic green sheets may contain a lead titanate ($PbTiO_3$) compound, a lead metaniobate ($PbNb_2O_6$) compound, a lead metatantalate ($PbTa_2O_6$) compound, or the like.

The conductor contained in the conductive paste for internal electrodes is composed of Ag as the main component, and can, for instance, contain up to 50% by weight of Pd.

In the method of manufacturing the monolithic piezoelectric ceramic device of the present invention, the internal electrodes each containing an alloy composed of Ag as the main component and the ceramic layers are simultaneously burned under the atmospheric conditions in which the oxygen concentration in the heating process and retention process are about 21% by volume or more, and the oxygen concentration in the cooling process is about 0.05% to 3% by volume. Therefore, Ag taken in grains in the heating process and retention process during burning precipitates in the grain boundaries during the cooling process to improve the piezoelectric characteristics which deteriorate due to Ag uptake, thereby improving the piezoelectric characteristics, particularly a piezoelectric strain constant (d), and sufficiently securing high reliability.

Therefore, a monolithic piezoelectric ceramic device further excellent in the piezoelectric characteristics and reliability can be obtained.

In order to achieve the object, a method of manufacturing a monolithic piezoelectric ceramic device in another aspect of the present invention comprises the steps of coating a conductive paste containing an alloy composed of Ag as a main component on a plurality of ceramic green sheets each containing a piezoelectric ceramic material, laminating the ceramic green sheets to form a laminate, first burning (referred to as "main burning" hereinafter) the laminate, and again burning (referred to as "re-burning" hereinafter) the burned laminate in an atmosphere in which the oxygen concentration is about 10% by volume or less.

The reason for limiting the oxygen concentration in the re-burning step to about 10% by volume or less is that with an oxygen concentration of over about 10% by volume, the effect of precipitating Ag, which has been taken in the ceramic grains in the main burning step, in the ceramic grain boundaries is not sufficiently exhibited, thereby failing to improve the piezoelectric characteristics and reliability. On the other hand, the lower limit of the oxygen concentration in re-burning is not limited. With an oxygen concentration of 0.05% by volume, an effect can still be obtained, and therefore, the oxygen concentration may be further decreased according to the burning conditions.

In the main burning step, for example, a lead zirconate titanate (PZT)-type compound is burned in air having an oxygen content of about 21% by volume, or an atmosphere having an oxygen content of about 21% by volume or more. The burning temperature in the maximum temperature region is set to a temperature at which the laminate is completely sintered in these atmospheric conditions, and specifically, a temperature at which the pack density of the sintered laminated body is 99% or more of theoretical density. The retention time in the maximum temperature region is also set based on the same idea as the burning temperature.

After retention in the maximum temperature region in the main burning step, the temperature may be decreased to about 300° C. or less, or room temperature, and then the re-burning step may be carried out.

For example, each of the heating rate and the cooling rate in the main burning step is set in the range of about 1 to 110° C./min, and the retention time in the maximum temperature region is set in the range of about 1 to 10 hours with the lead zirconate titanate (PZT)-type compound.

In the re-burning step, for example, the lead zirconate titanate (PZT)-type compound is burned in an atmosphere having an oxygen content of about 10% by volume or less. The burning temperature in the maximum temperature region is set to be lower than the burning temperature in the maximum temperature region in the main burning step. For example, the burning temperature is set to be about 20° C. to 50° C. lower than the top temperature in the main burning step with a lead zirconate titanate (PZT)-type compound. The reason for this is that deterioration in the piezoelectric characteristics due to Pb evaporation is prevented.

With the lead zirconate titanate (PZT)-type compound, each of the heating rate and the cooling rate in the re-burning step is set, for example, in the range of about 1 to 10° C./min, and the retention time in the maximum temperature region is set in the range of about 1 to 10 hours.

However, the burning conditions for main burning and re-burning are not limited to the above conditions, and the optimum burning temperature, heating rate, retention time and cooling rate may be selected according to the type (composition system) of the piezoelectric ceramic material.

Besides the lead zirconate titanate (PZT)-type compound, the piezoelectric ceramic material contained in the ceramic green sheets may contain a lead titanate ($PbTiO_3$) compound, a lead metaniobate ($PbNb_2O_6$) compound, a lead metatantalate ($PbTa_2O_6$) compound, or the like.

The conductor contained in the conductive paste for internal electrodes is composed of Ag as the main component, and may contain up to about 50% by weight of Pd.

The atmosphere having the oxygen concentration of about 10% by volume or less can be an atmosphere containing nitrogen as a main component.

Besides nitrogen, the atmosphere gas may contain an inert gas such as argon, carbon dioxide or the like to an extent causing no adverse effect on the piezoelectric characteristics.

The main burning and re-burning steps are preferably respectively performed by separate burning apparatuses. This is because the atmosphere in each burning step can be precisely controlled.

In the method of manufacturing the monolithic piezoelectric ceramic device of the present invention where the monolithic piezoelectric ceramic device comprising internal electrodes each containing an alloy composed of Ag as the main component and formed through ceramic layers, therefore, the internal electrodes and the ceramic layers are simultaneously burned, and then again burned in the atmosphere in which the oxygen concentration is about 10% by volume or less. Ag taken in ceramic grains in the main burning step precipitates in the grain boundaries in the re-burning step to improve the piezoelectric characteristics of the device, which deteriorate due to Ag uptake, thereby improving the piezoelectric characteristics, particularly a piezoelectric strain constant (d), and sufficiently securing high reliability.

Therefore, a monolithic piezoelectric ceramic device further excellent in the piezoelectric characteristics and reliability can be obtained.

DESCRIPTION OF THE PREFERRED EMBODIMENTS

A method of manufacturing a monolithic piezoelectric actuator as an example of a monolithic piezoelectric ceramic device of the present invention will be described in detail below with reference to the drawings and several embodiments.

First Embodiment

As starting raw materials, $Pb_3O_4$, $TiO_2$, $ZrO_2$, and $SrCO_3$ are prepared. Then, the starting raw materials are weighed so that a piezoelectric ceramic composition $Pb_{0.98}Sr_{0.02}(Zr_{0.45}Ti_{0.55})O_3$ is obtained, and the resultant mixture is wet mixed by a ball mill. The mixture is then dehydrated, dried, calcined at a temperature of 800° C. for 2 hours, and then ground to obtain a calcined powder.

Then, additives such as an acrylic organic binder, an organic solvent and a plasticizer are added to the calcined powder, and then the resultant mixture is wet mixed by the ball mill to obtain slurry.

The thus-obtained slurry is formed into a sheet by the doctor blade method to prepare a ceramic green sheet having a thickness of about 40 μm.

A conductive paste containing a conductor having an Ag/Pd ratio of 80% by weight/20% by weight is coated on the ceramic green sheet by a screen printing method so that the thickness after burning is 1.0 to 3.0 μm, and then dried to obtain the ceramic green sheet having a layer formed for an internal electrode.

Then, a plurality of the ceramic green sheets is laminated, and press-bonded by a heat press to obtain an integrated laminate.

Next, the binder component is sufficiently removed from the laminate at a temperature of about 500° C., and then the laminate is burned in each of the burning profiles and burning atmospheres shown in Table 1.

The heating rate is 3° C./min, the retention time in the retention process is 2 hours and the cooling rate is 4° C./min.

In Table 1, the burning atmospheres marked with * are out of the range of the present invention, and all the other burning atmospheres are within the range of the present invention.

TABLE 1

| | Oxygen concentration (unit: % by volume) | | |
|---|---|---|---|
| Burning atmosphere No. | Heating process from 600° C. to 1050° C. | Retention process at 1050° C. | Cooling process from 1050° to 300° C. |
| J1* | 21 | 21 | 5 |
| J2 | 21 | 21 | 3 |
| J3 | 21 | 21 | 1 |
| J4 | 21 | 21 | 0.5 |
| J5 | 21 | 21 | 0.05 |
| J6* | 21 | 21 | 0.03 |
| J7 | 90 | 90 | 1 |
| J8 | 90 | 90 | 0.5 |
| J9* | 21 | 21 | 21 |
| J10* | 90 | 90 | 90 |
| J11* | 1 | 21 | 21 |

After burning, each of the laminates is cut in a predetermined size, and an external electrode is formed by coating and burning, and then electrically connected to the internal electrodes to obtain a piezoelectric ceramic device.

Figure 1:
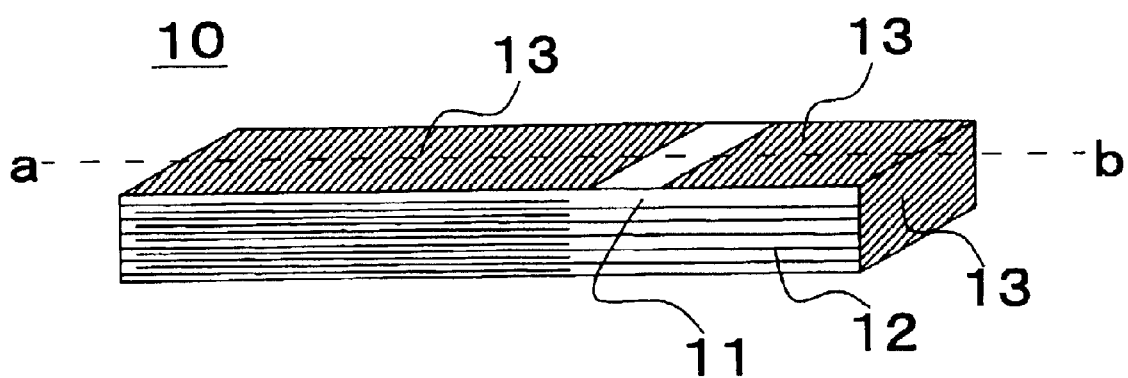
FIG. 1 is a perspective view showing a monolithic piezoelectric actuator according to an embodiment of the present invention.
Figure 2:
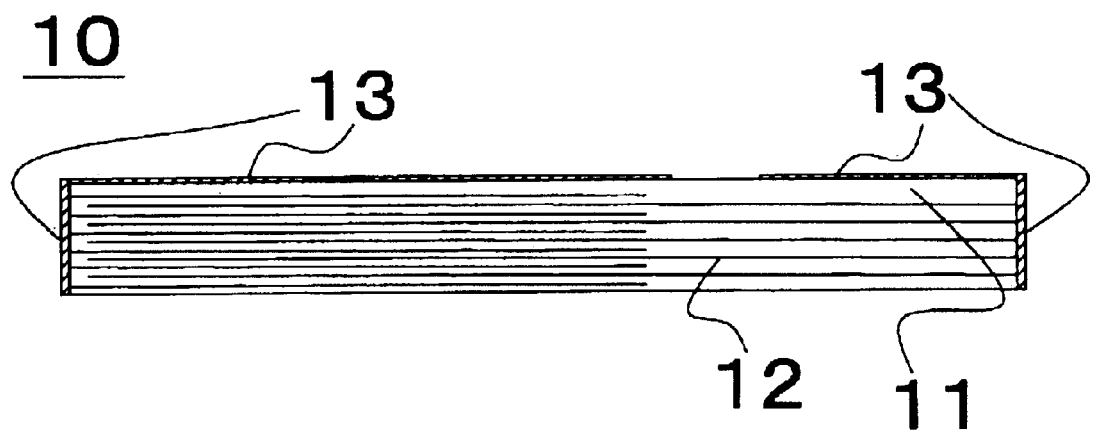
FIG. 2 is a sectional view of the monolithic piezoelectric actuator shown in FIG. 1, taken along line a-b in FIG. 1.

Next, polarization is performed in an insulating oil at 60° C. with a DC electric field of 4.0 kV/mm applied for 60 minutes. Then, aging is performed at 120 to 200° C. in air for 30 to 60 minutes to obtain the intended monolithic piezoelectric actuator 10 shown in FIGS. 1 and 2. In FIGS. 1 and 2, reference numeral 11 denotes an internal electrode, reference numeral 12 denotes an external electrode, and reference numeral 13 denotes piezoelectric ceramic.

The piezoelectric strain constant $|d_{31}|$ of the monolithic piezoelectric actuator and the electrical resistivity p of the piezoelectric ceramic were measured. The results are shown in Table 2.

The piezoelectric strain constant $|d_{31}|$ was determined as a piezoelectric strain constant in the 31 direction determined by measuring the strain amount with a laser Doppler vibration meter. The resistivity ρ was determined by measuring the insulation resistance with a DC voltage of 50 V applied between the internal electrodes through the ceramic layers for 30 seconds, multiplying the insulation resistance by the electrode area, and dividing the product by the thickness of the ceramic layer between the internal electrodes.

In Table 2, the burning atmospheres marked with * are out of the range of the present invention, and all the other burning atmospheres are within the range of the present invention.

TABLE 2

| | Burning | Characteristics | |
|---|---|---|---|
| Sample No. | atmospheric condition No. | $|d_{31}|$ ($10^{-12}$ C/N) | ρ ($10^{12}$ Ω · cm) |
| 1 | J1* | 208 | 0.40 |
| 2 | J2 | 207 | 6.5 |
| 3 | J3 | 211 | 7.8 |
| 4 | J4 | 206 | 5.4 |
| 5 | J5 | 209 | 6.2 |
| 6 | J6* | 190 | 0.44 |
| 7 | J7 | 210 | 6.4 |
| 8 | J8 | 210 | 6.5 |
| 9 | J9* | 188 | 0.55 |
| 10 | J10* | 193 | 0.58 |
| 11 | J11* | 195 | 0.54 |

Tables 1 and 2 indicate that in Sample Nos. 2 to 5 within the range of the present invention, the electrical resistivity ρ of the piezoelectric ceramic and the piezoelectric strain constant $|d_{31}|$ are improved.

It is also found that in Sample Nos. 9 and 10 under burning atmospheric conditions in which the oxygen concentrations are 21% by volume and 90% by volumes, respectively, in the burning temperature range over all steps including the heating process from 600 to 1050° C., the retention process at 1050° C., and the cooling process from 1050 to 300° C., and in Sample No. 11 under an atmospheric condition in which the oxygen concentration is 1% by volume in the heating process, and 21% by volume in the retention process and cooling process, the electrical resistivity ρ of the piezoelectric ceramic and the piezoelectric strain constant $|d_{31}|$ are not sufficiently improved, as compared with Sample Nos. 2 to 5 within the range of the present invention.

This is possibly due to the effect of the lowered oxygen concentration of the atmosphere in the cooling process during burning.

In any one of the cases including Sample Nos. 2 to 5 within the range of the present invention, the laminate is burned in an oxygen atmosphere having an oxygen concentration of as high as 21% by volume in the heating process and retention process, and the Ag contained in the internal electrodes of the monolithic piezoelectric actuator enters grains in the piezoelectric ceramic layers to form a solid solution with Ag.

In this state, Ag functions to inhibit the piezoelectric characteristics and reliability if the laminate is burned in an oxygen atmospheric condition out of the range of the present invention in the cooling process.

However, when the laminate is burned in an oxygen atmospheric condition containing about 0.05% to 3% by volume of the present invention in the cooling process, Ag dissolved in the ceramic grains precipitates due to a decrease in the oxygen concentration to create a state close to a piezoelectric ceramic state before dissolution. Therefore, the Ag possibly does not function to inhibit the piezoelectric characteristics and reliability.

It is also found that as in Sample No. 1, under a burning atmospheric condition in which the oxygen concentrations in the heating process and retention process are 21% by volume, and the oxygen concentration in the cooling process is 5% by volume in the above-described burning temperature range, the piezoelectric strain constant $|d_{31}|$ is the same level as Samples Nos. 2 to 5 within the range of the present invention, while the electrical resistivity ρ of the piezoelectric ceramic is lower than Sample Nos. 2 to 5, thereby failing to secure sufficient insulation.

This is possibly due to the fact that the burning atmosphere having an oxygen concentration of 5% by volume in the cooling process has an insufficient effect of preventing deterioration in the piezoelectric characteristics and reliability when the oxygen concentration is decreased to precipitate Ag dissolved in the ceramic grains in the grain boundaries. Therefore, at least this burning condition is found to be undesirable.

It is further found that as in Sample No. 6, under a burning atmospheric condition in which the oxygen concentrations in the heating process and retention process are 21% by volume, and the oxygen concentration in the cooling process is 0.03% by volume, the piezoelectric strain constant $|d_{31}|$ and the electrical resistivity ρ of the piezoelectric ceramic are lower than Sample Nos. 2 to 5, thereby failing to secure sufficient piezoelectric characteristics and insulation.

This is possibly due to the fact that in the burning atmosphere having an oxygen concentration of 0.03% by volume in the cooling process, precipitation of a heterogeneous phase is observed on the surface of the piezoelectric ceramic, and the heterogeneous phase inhibits the piezoelectric characteristics and reliability. Therefore, at least this burning condition is found to be undesirable.

It is further found that as in Sample Nos. 7 and 8, under a burning atmospheric condition in which the oxygen concentrations in the heating process and retention process are 90% by volume, and the oxygen concentration in the cooling process is 0.5% by volume to 1% by volume, the electrical resistivity ρ of the piezoelectric ceramic is improved, and the piezoelectric strain constant $|d_{31}|$ is kept at the same level or higher.

Namely, it is found that the characteristics in the same level as Sample Nos. 2 to 5 are obtained.

The foregoing results show that under a burning atmospheric condition in which the oxygen concentration in the heating process is about 0.05% to 3% by volume, and the oxygen concentrations in the retention process and cooling process are about 21% by volume or more, the piezoelectric characteristics and insulation can be improved.

Second Embodiment

As starting raw materials, $Pb_3O_4$, $TiO_2$, $ZrO_2$, $Nb_2O_5$, NiO, and $Fe_2O_3$ are prepared. Then, the starting raw materials are weighed so that a piezoelectric ceramic composition containing 99% by weight of $Pb_{1.00}\{(Ni_{1/3}Nb_{2/3})_{0.04}Zr_{0.25}Ti_{0.35}\}O_3$ as a main component, and 1% by weight of $Fe_2O_3$ as an additive is obtained, and the resultant mixture is wet mixed by a ball mill.

The mixture is then dehydrated, dried, calcinated at a temperature of 800° C. for 2 hours, and then ground to obtain a calcined powder.

Then, the same method as the first embodiment is repeated to obtain the intended monolithic piezoelectric actuator 10 shown in FIGS. 1 and 2.

The piezoelectric strain constant $|d_{31}|$ of the monolithic piezoelectric actuator and the electrical resistivity ρ of the piezoelectric ceramic were measured. The results are shown in Table 3.

The piezoelectric strain constant $|d_{31}|$ was determined as a piezoelectric strain constant in the 31 direction determined by measuring the strain amount with a laser Doppler vibration meter. The resistivity ρ was determined by measuring the insulation resistance with a DC voltage of 50 V applied between the internal electrodes through the ceramic layers for 30 seconds, multiplying the insulation resistance by the electrode area, and dividing the product by the thickness of the ceramic layer between the internal electrodes.

In Table 3, the burning atmospheres marked with * are out of the range of the present invention, and all the other burning atmospheres are within the range of the present invention.

TABLE 3

| Sample No. | Burning atmospheric condition No. | Characteristics $|d_{31}|$ ($10^{-12}$ C/N) | ρ ($10^{12}$ Ω · cm) |
|---|---|---|---|
| 12 | J1* | 295 | 0.35 |
| 13 | J2 | 310 | 8.5 |
| 14 | J3 | 309 | 6.4 |
| 15 | J4 | 315 | 6.6 |
| 16 | J5 | 315 | 5.8 |
| 17 | J6* | 290 | 0.74 |
| 18 | J7 | 306 | 5.4 |
| 19 | J8 | 307 | 5.8 |
| 20 | J9* | 280 | 0.49 |
| 21 | J10* | 285 | 0.63 |
| 22 | J11* | 290 | 0.46 |

Tables 1 and 3 indicate that in Sample Nos. 13 to 16 within the range of the present invention, the electrical resistivity ρ of the piezoelectric ceramic and the piezoelectric strain constant $|d_{31}|$ are improved.

It is also found that in Sample Nos. 20 and 21 under burning atmospheric conditions in which the oxygen concentrations are 21% by volume and 90% by volumes, respectively, in the burning temperature range over all steps including the heating process from 600 to 1050° C., the retention process at 1050° C., and the cooling process from 1050 to 300° C., and in Sample No. 22 under an atmospheric condition in which the oxygen concentration is 1% by volume in the heating process, and 21% by volume in the retention process and cooling process, the electrical resistivity ρ of the piezoelectric ceramic and the piezoelectric strain constant $|d_{31}|$ are not sufficiently improved, as compared with Sample Nos. 13 to 16 within the range of the present invention.

This possibly due to the effect of the lowered oxygen concentration of the atmosphere in the cooling process during burning. Namely, in any one of the cases including Sample Nos. 13 to 16 within the range of the present invention, the laminate is burned in an oxygen atmosphere having an oxygen concentration of as high as 21% by volume in the heating process and retention process, so that the Ag contained in the internal electrodes of the monolithic piezoelectric actuator enters grains in the piezoelectric ceramic layers to form a solid solution with Ag. In this state, if the laminate is burned under an oxygen atmospheric condition out of range of the present invention in the cooling process, the Ag functions to inhibit the piezoelectric characteristics and reliability.

However, when the laminate is burned in an oxygen atmospheric condition containing the about 0.05% to 3% by volume of the present invention in the cooling process, Ag dissolved in the ceramic grains precipitates due to a decrease in the oxygen concentration to create a state close to a piezoelectric ceramic state before dissolution. Therefore, the Ag possibly does not function to inhibit the piezoelectric characteristics and reliability.

It is also found that as in Sample No. 12, under a burning atmospheric condition in which the oxygen concentrations in the heating process and retention process are 21% by volume, and the oxygen concentration in the cooling process is 5% by volume in the above-described burning temperature range, the piezoelectric strain constant $|d_{31}|$ is the same level as Samples Nos. 13 to 16 within the range of the present invention, while the electrical resistivity ρ of the piezoelectric ceramic is lower than Sample Nos. 13 to 16, thereby failing to secure sufficient insulation.

This is possibly due to the fact that the burning atmosphere having an oxygen concentration of 5% by volume in the cooling process has an insufficient effect of preventing deterioration in the piezoelectric characteristics and reliability when the oxygen concentration is decreased to precipitate Ag dissolved in the ceramic grains in the grain boundaries. Therefore, at least this burning condition is found to be undesirable.

It is further found that as in Sample No. 17, under a burning atmospheric condition in which the oxygen concentrations in the heating process and retention process are 21% by volume, and the oxygen concentration in the cooling process is 0.03% by volume, the piezoelectric strain constant $|d_{31}|$ and the electrical resistivity ρ of the piezoelectric ceramic are lower than Sample Nos. 13 to 16, thereby failing to secure sufficient piezoelectric characteristics and insulation.

This is possibly due to the fact that in the burning atmosphere having an oxygen concentration of 0.03% by volume in the cooling process, precipitation of a heterogeneous phase is observed on the surface of the piezoelectric ceramic, and the heterogeneous phase inhibits the piezoelectric characteristics and reliability. Therefore, at least this burning condition is found to be undesirable.

It is further found that as in Sample Nos. 18 and 19, under a burning atmospheric condition in which the oxygen concentrations in the heating process and retention process are 90% by volume, and the oxygen concentration in the cooling process is 0.5% by volume to 1% by volume, the electrical resistivity ρ of the piezoelectric ceramic is improved, and the piezoelectric strain constant $|d_{31}|$ is kept at the same level or higher.

Namely, it is found that the characteristics in the same level as Sample Nos. 13 to 16 are obtained.

These results show that under a burning atmospheric condition in which the oxygen concentration in the heating process is about 0.05% to 3% by volume, and the oxygen concentrations in the retention process and cooling process are about 21% by volume or more, the piezoelectric characteristics and insulation can be improved.

Figure 4:
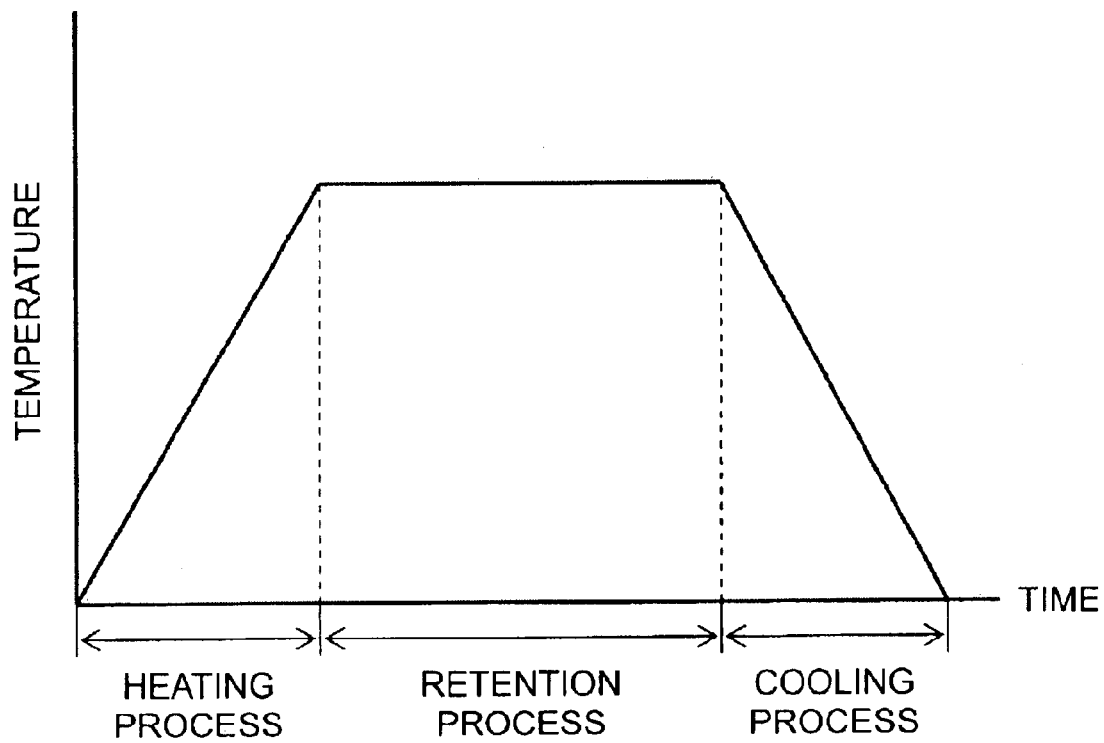
FIG. 4 is a graph schematically showing the relationship between the burning temperature and time in a method of manufacturing a monolithic piezoelectric ceramic element according to first and second embodiments of the present invention.

FIG. 4 is a graph schematically showing the relationship between the burning temperature and time in a method of manufacturing a monolithic piezoelectric ceramic element according to first and second embodiments of the present invention.

Third Embodiment

As starting raw materials, $Pb_3O_4$, $TiO_2$, $ZrO_2$, and $SrCO_3$ are prepared. Then, the starting raw materials are weighed so that a piezoelectric ceramic composition $Pb_{0.98}Sr_{0.02}(Zr_{0.45}Ti_{0.55})O_3$ is obtained, and the resultant mixture is wet mixed by a ball mill. Then the mixture is dehydrated, dried, calcinated at a temperature of 800° C. for 2 hours, and then ground to obtain a calcined powder.

Additives such as an acrylic organic binder, an organic solvent, and a plasticizer are added to the calcined powder, and then the resultant mixture is wet mixed by the ball mill to obtain slurry.

The thus-obtained slurry is formed into a sheet by the doctor blade method to prepare a ceramic green sheet having a thickness of about 40 μm.

A conductive paste containing a conductor having an Ag/Pd ratio of 80% by weight/20% by weight is coated on the ceramic green sheet by a screen printing method so that the thickness after burning is 1.0 to 3.0 μm, and then dried to obtain the ceramic green sheet having a layer formed for an internal electrode. Then, a plurality of the ceramic green sheets are laminated, and press-bonded by a heat press to obtain an integrated laminate.

Next, the binder component is sufficiently removed from the laminate at a temperature of about 500° C., and then main burning and re-burning of the laminate are performed in each of the burning profiles and burning atmospheres shown in Table 4.

The main burning and re-burning are respectively performed by separate burning apparatuses. The heating rates in both the main burning and re-burning are 3° C./min, the retention time in the maximum temperature region is 2 hours, and the cooling rate is 4° C./min.

In Table 4, the burning atmosphere marked with * is out of the range of the present invention, and all the other burning atmospheres are within the range of the present invention.

TABLE 4

| | | Main burning | | | Re-burning | | |
|---|---|---|---|---|---|---|---|
| Burning atmospheric condition No. | Burning Atmosphere (% by volume) | Heating process from 600° C. to 1050° C. | Retention process at 1050° C. | Cooling process from 1050° C. to 300° C. | Heating process from 600° C. to 1030° C. | Retention process at 1030° C. | Cooling process from 1030° C. to 300° C. |
| J1 | Oxygen | 21 | 21 | 21 | 0.05 | 0.05 | 0.05 |
| | Nitrogen | 79 | 79 | 79 | 99.95 | 99.95 | 99.95 |
| J2 | Oxygen | 21 | 21 | 21 | 1 | 1 | 1 |
| | Nitrogen | 79 | 79 | 79 | 99 | 99 | 99 |
| J3 | Oxygen | 21 | 21 | 21 | 10 | 10 | 10 |
| | Nitrogen | 79 | 79 | 79 | 89 | 89 | 89 |
| J4* | Oxygen | 21 | 21 | 21 | 21 | 21 | 21 |
| | Nitrogen | 79 | 79 | 79 | 79 | 79 | 79 |

After re-burning, each of the laminates is cut in a predetermined size, and an external electrode is formed by coating and burning, and then electrically connected to the internal electrode to obtain a monolithic piezoelectric actuator.

Next, polarization is performed in an insulating oil of 60° C. with a DC electric field of 4.0 kV/mm applied for 60 minutes. Then, aging is performed at 120 to 200° C. in air for 30 to 60 minutes to obtain the intended monolithic piezoelectric actuator 10 shown in FIG. 1. In FIG. 1, reference numeral 11 denotes an internal electrode, reference numeral 12 denotes an external electrode, and reference numeral 13 denotes a piezoelectric ceramic.

The piezoelectric strain constant $|d_{31}|$ of the monolithic piezoelectric actuator and the electrical resistivity $\rho$ of the piezoelectric ceramic were measured. The results are shown in Table 5.

The piezoelectric strain constant $|d_{31}|$ was determined as a piezoelectric strain constant in the 31 direction determined by measuring the strain amount with a laser Doppler vibration meter. The resistivity $\rho$ was determined by measuring insulation resistance with a DC voltage of 50 V applied between the internal electrodes through the ceramic layers for 30 seconds, multiplying the insulation resistance by the electrode area, and dividing the product by the thickness of the ceramic layer between the internal electrodes.

An average (referred to as "AVE" in Table 4) and 3σ (σ represents a standard deviation) of the piezoelectric strain constant $|d_{31}|$, and an average of the resistivity $\rho$ are shown in Table 4.

In Table 5, the burning atmosphere marked with * is out of the range of the present invention, and all the other burning atmospheres are within the range of the present invention.

TABLE 5

| | | Characteristics | | |
|---|---|---|---|---|
| | Burning atmospheric | $|d_{31}|$ ($10^{-12}$ C/N) | | $\rho$ (1012 Ω · cm) |
| Sample No. | condition No. | AVE. | 3σ | AVE. |
| 1 | J1 | 158 | 16 | 7.0 |
| 2 | J2 | 160 | 15 | 6.5 |
| 3 | J3 | 156 | 18 | 7.2 |
| 4* | J4* | 130 | 43 | 0.83 |

Tables 4 and 5 indicate that in Sample Nos. 1, 2 and 3 in which re-burning is performed in nitrogen atmospheres respectively having oxygen concentrations of 0.05% by volume, 1% by volume and 10% by volume after main burning, the electrical resistivity $\rho$ of the piezoelectric ceramic and the piezoelectric strain constant $|d_{31}|$ are improved, and the variation in $d_{31}$ is decreased, as compared with Sample No. 4 in which re-burning is performed in air, i.e., an atmosphere having an oxygen concentration of about 21% by volume.

This is possibly due to a lowered oxygen concentration in the re-burning atmosphere. Namely, Ag contained grains during the main burning step precipitates at the grain boundaries in the re-burning step to improve the piezoelectric characteristics of the device, which deteriorate due to Ag uptake.

The foregoing shows that by satisfying the nitrogen atmospheric condition as a burning atmospheric condition in which the oxygen concentration in the re-burning step after the main burning step is about 10% by volume or less, the piezoelectric characteristics and insulation can be improved.

Fourth Embodiment

As starting raw materials, $Pb_3O_4$, $TiO_2$, $ZrO_2$, $Cr_2O_3$, and $Sb_2O_3$ are prepared. Then, the starting raw materials are weighed so that a piezoelectric ceramic composition containing 97% by weight of $Pb(Zr_{0.47}Ti_{0.53})O_3$, and 1% by weight of $Cr_2O_3$ and 2% by weight of $Sb_2O_3$ as additives is obtained, and the resultant mixture is wet mixed by a ball mill. Furthermore, the mixture is dehydrated, dried, calcinated at a temperature of 800° C. for 2 hours, and then ground to obtain a calcined powder.

Then, additives such as an acrylic organic binder, an organic solvent, and a plasticizer are added to the calcined powder, and the resultant mixture is wet mixed by the ball mill to obtain slurry.

The thus-obtained slurry is formed into a sheet by the doctor blade method to prepare a ceramic green sheet having a thickness of about 80 μm.

A conductive paste containing a conductor having an Ag/Pd ratio of 80% by weight/20% by weight is coated on the ceramic green sheet by a screen printing method so that the thickness after burning is 1.0 to 3.0 μm, and then dried to obtain the ceramic green sheet having a layer formed for an internal electrode. Then, a plurality of the ceramic green sheets are laminated, and press-bonded by a heat press to obtain an integrated laminate.

Next, the binder component is sufficiently removed from the laminate at a temperature of about 500° C., and then main burning and re-burning of the laminate are performed in each of the burning profiles and burning atmospheres shown in Table 6.

The main burning and re-burning are respectively performed by separate burning apparatuses. The heating rates in both the main burning and re-burning are 3° C./min, the retention time in the maximum temperature region is 2 hours, and the cooling rate is 4° C./min.

In Table 6, the burning atmosphere marked with * is out of the range of the present invention, and all the other burning atmospheres are within the range of the present invention.

mechanical part coefficient $Qm_{31}$ of the monolithic piezoelectric actuator, and the electrical resistivity ρ of the piezoelectric ceramic are improved, as compared with Sample No. 8 in which re-burning is performed in air, i.e., an atmosphere having an oxygen concentration of about 21% by volume.

TABLE 6

| Burning atmospheric condition No. | Burning Atmosphere (% by volume) | Main burning | | | Re-burning | | |
|---|---|---|---|---|---|---|---|
| | | Heating process from 600° C. to 1000° C. | Retention process at 1000° C. | Cooling process from 1000° C. to 300° C. | Heating process from 600° C. to 970° C. | Retention process at 970° C. | Cooling process from 970° C. to 300° C. |
| J1 | Oxygen | 21 | 21 | 21 | 0.05 | 0.05 | 0.05 |
|    | Nitrogen | 79 | 79 | 79 | 99.95 | 99.95 | 99.95 |
| J2 | Oxygen | 21 | 21 | 21 | 1 | 1 | 1 |
|    | Nitrogen | 79 | 79 | 79 | 99 | 99 | 99 |
| J3 | Oxygen | 21 | 21 | 21 | 10 | 10 | 10 |
|    | Nitrogen | 79 | 79 | 79 | 89 | 89 | 89 |
| J4* | Oxygen | 21 | 21 | 21 | 21 | 21 | 21 |
|    | Nitrogen | 79 | 79 | 79 | 79 | 79 | 79 |

After re-burning, each of the laminates is cut in a predetermined size, and an external electrode is formed by coating and burning, and then electrically connected to the internal electrode to obtain a monolithic piezoelectric actuator.

Next, polarization is performed in an insulating oil of 60° C. with a DC electric field of 4.0 kV/mm applied for 60 minutes. Then, aging is performed at 120 to 200° C. in air for 30 to 60 minutes to obtain an intended monolithic piezoelectric actuator 10 as shown in FIG. 1 by the same method as the third embodiment.

The electromechanical coupling coefficient $K_{31}$ and mechanical part coefficient $Qm_{31}$ of the monolithic piezoelectric actuator were measured by an impedance analyzer.

The resistivity ρ was determined by measuring the insulation resistance with a DC voltage of 50 V applied between the internal electrodes through the ceramic layers for 30 seconds, multiplying the insulation resistance by the electrode area, and dividing the product by the thickness of the ceramic layer between the internal electrodes.

The results are shown in Table 7. Averages (referred to as "AVE." in the table) of $K_{31}$, $Qm_3$, and ρ are shown in the table.

In Table 7, the burning atmosphere marked with * is out of the range of the present invention, and all the other burning atmospheres are within the range of the present invention.

TABLE 7

| | | Characteristics | | |
|---|---|---|---|---|
| Sample No. | Burning atmospheric condition No. | $K_{31}$ (%) AVE. | $Qm_{31}$ (Ω) AVE. | ρ ($10^{12}$ Ω · cm) AVE. |
| 5 | J1 | 30.0 | 420 | 6.8 |
| 6 | J2 | 30.4 | 430 | 6.9 |
| 7 | J3 | 30.1 | 440 | 7.5 |
| 8* | J4* | 28.6 | 380 | 0.63 |

Tables 6 and 7 indicate that in Sample Nos. 5, 6 and 7 in which re-burning is performed in nitrogen atmospheres respectively having oxygen concentrations of 0.05% by volume, 1% by volume and 10% by volume after main burning, the electromechanical coupling coefficient $K_{31}$ and This is possibly due to a lowered oxygen concentration in the re-burning atmosphere.

Namely, Ag contained grains during the main burning step precipitates at the grain boundaries in the re-burning step to improve the piezoelectric characteristics of the device, which deteriorate due to Ag uptake.

As described above, by satisfying the nitrogen atmospheric condition as a burning atmospheric condition in which the oxygen concentration in the re-burning step after the main burning step is 10% by volume or less, the piezoelectric characteristics and insulation can be improved.

Figure 5:
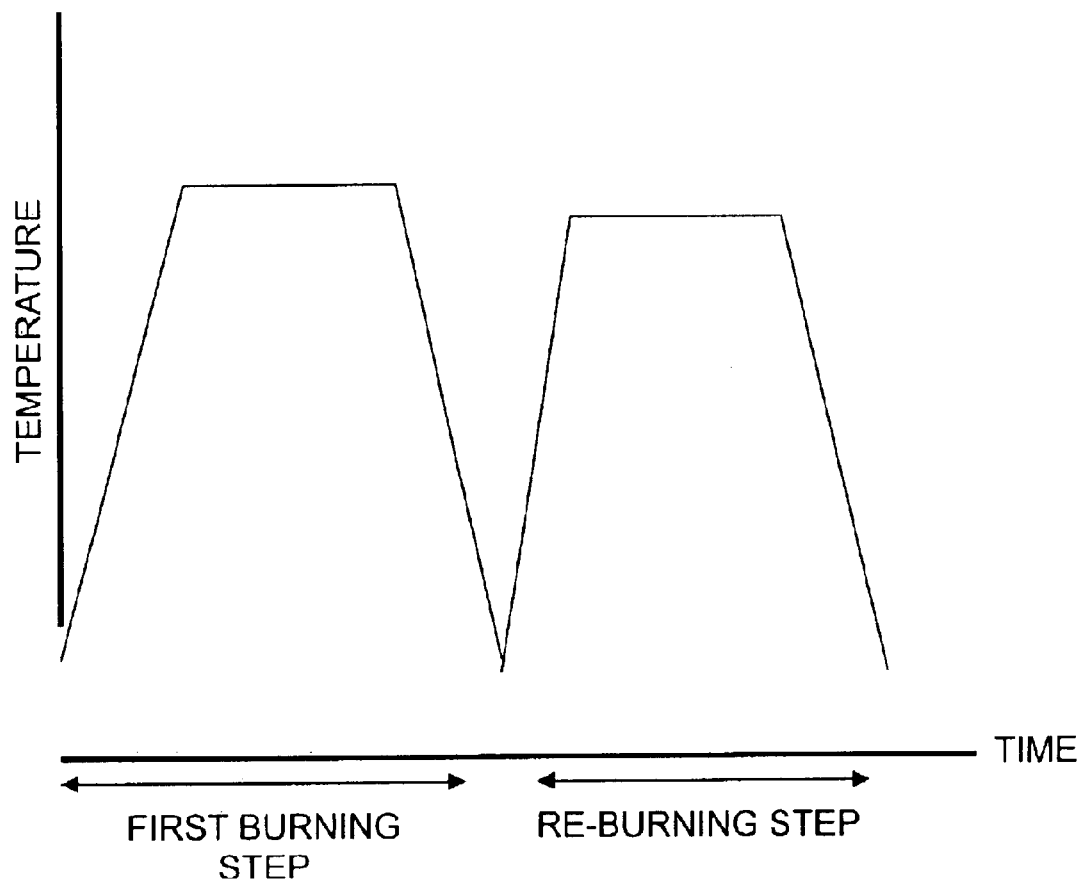
FIG. 5 is a graph schematically showing a relationship between the burning temperature and time in a method of manufacturing a monolithic piezoelectric ceramic element according to third and fourth embodiments of the present invention.

FIG. 5 is a graph schematically showing a relationship between the burning temperature and time in a method of manufacturing a monolithic piezoelectric ceramic element according to third and fourth embodiments of the present invention.

Figure 3:
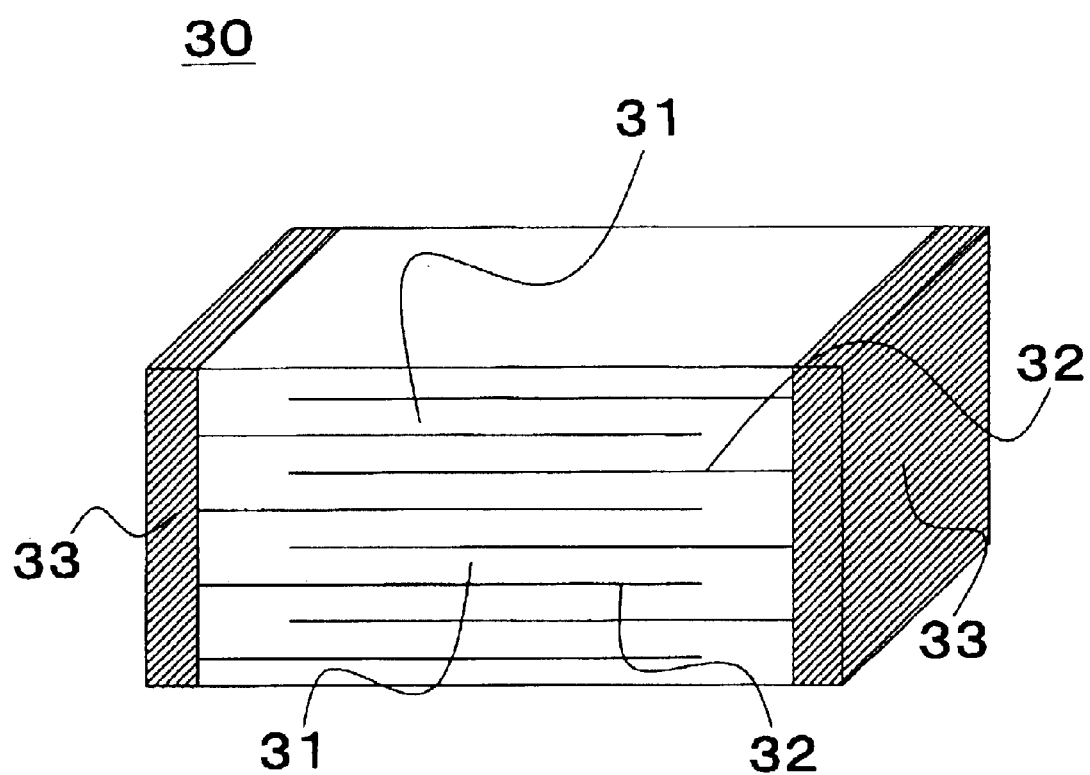
FIG. 3 is a perspective view showing an example of an ink-jet monolithic piezoelectric device to which the present invention can be applied.

Although, only the monolithic piezoelectric actuator is described in the above embodiments, the present invention is not limited to this, and, of course, the present invention can be applied to any monolithic piezoelectric ceramic device such as a piezoelectric resonator, a piezoelectric filter, a piezoelectric buzzer, a piezoelectric transformer, etc., which utilize a piezoelectric effect. For instance, FIG. 3 is a perspective view showing an ink-jet monolithic piezoelectric device 30 to which the present invention can be applied. In FIG. 3, reference numeral 31 denotes piezoelectric ceramic, reference numeral 32 denotes an internal electrode, and reference numeral 33 denotes an external electrode.

In the method of manufacturing a monolithic piezoelectric ceramic device of the present invention, internal electrodes each containing an alloy composed of Ag as a main component, and ceramic layers are simultaneously burned under an atmospheric condition in which the oxygen concentrations in the heating process and retention process are about 21% by volume or more, and the oxygen concentration in the cooling process is about 0.05% to 3% by volume. Therefore, Ag taken in grains during the heating process and retention process during burning precipitates in the grain boundaries in the cooling process to improve the piezoelectric characteristics, which deteriorate due to Ag uptake, thereby improving the piezoelectric characteristics, particularly the piezoelectric strain constant (d), and sufficiently securing high reliability. Therefore, a monolithic piezoelectric ceramic device having further excellent piezoelectric characteristics and reliability can be obtained.

In the method of manufacturing the monolithic piezoelectric ceramic device of the present invention, a monolithic piezoelectric ceramic device comprising the internal electrodes, each of which contain Ag as a main component, and which are formed through the ceramic layers, the ceramic layers and the internal electrodes may be simultaneously burned, and then further re-burned in an atmosphere having an oxygen concentration of about 10% by volume or less. In this case, Ag taken in grains during burning precipitates in the grain boundaries in the re-burning step to improve the piezoelectric characteristics, which deteriorate due to Ag uptake, thereby improving the piezoelectric characteristics, particularly the piezoelectric strain constant (d), and sufficiently securing high reliability. Therefore, a monolithic piezoelectric ceramic device having further excellent piezoelectric characteristics and reliability can be obtained.

What is claimed is:

1. A method of manufacturing a monolithic piezoelectric ceramic device, comprising burning a laminate comprising a plurality of ceramic green sheets of piezoelectric ceramic material and containing a conductive paste comprising Ag sandwiched between at least one pair of said sheets by a process which comprises heating, retention at elevated temperature and cooling, wherein the burning of the laminate is conducted under an atmospheric condition in which the oxygen concentrations in the heating and the retention are about 21% by volume or more, and the oxygen concentration in the cooling is about 0.05% to 3% by volume.

2. A method of manufacturing a monolithic piezoelectric ceramic device according to claim 1, wherein the conductive paste comprises Ag as a main conductive component and the piezoelectric ceramic material comprising a Pb compound.

3. A method of manufacturing a monolithic piezoelectric ceramic device according to claim 2, wherein the burned laminate is re-burned in an atmosphere in which the oxygen concentration is about 10% by volume or less.

4. A method of manufacturing a monolithic piezoelectric ceramic device according to claim 3, wherein the atmosphere having an oxygen concentration of about 10% by volume or less is an atmosphere containing nitrogen as a main component.

5. A method of manufacturing a monolithic piezoelectric ceramic device according to claim 4, wherein the first burning step comprises burning the laminate in air or an atmosphere having an oxygen concentration which is the same as or higher than that in air.

6. A method of manufacturing a monolithic piezoelectric ceramic device according to claim 5, wherein the burning temperature in the re-burning step is lower than the burning temperature in the first burning step.

7. A method of manufacturing a monolithic piezoelectric ceramic device according to claim 6, wherein the burning temperature in the re-burning step is about 20° C. to 50° C. lower than the burning temperature in the first burning step.

8. A method of manufacturing a monolithic piezoelectric ceramic device according to claim 7, wherein the oxygen concentration in the re-burning is at least about 0.05%.

9. A method of manufacturing a monolithic piezoelectric ceramic device according to claim 8, wherein the first burning step and re-burning are conducted in separate burning apparatus.

10. A method of manufacturing a monolithic piezoelectric ceramic device according to claim 9, wherein the conductive paste contains up to about 50% Pd.

11. A method of manufacturing a monolithic piezoelectric ceramic device according to claim 10, wherein the piezoelectric ceramic is a lead zirconate titanate.

12. A method of manufacturing a monolithic piezoelectric ceramic device according to claim 11, wherein the heating and cooling is at a rate of about 1–10° C./min and the retention period is about 1–10 hours.

13. A method of manufacturing a monolithic piezoelectric ceramic device according to claim 2, wherein the burning comprises burning the laminate in air or an atmosphere having an oxygen concentration which is the same as or higher than that in air.

14. A method of manufacturing a monolithic piezoelectric ceramic device according to claim 13, wherein the conductive paste contains up to about 50% Pd.

15. A method of manufacturing a monolithic piezoelectric ceramic device according to claim 14, wherein the piezoelectric ceramic is a lead zirconate titanate.

16. A method of manufacturing a monolithic piezoelectric ceramic device according to claim 1, wherein the first burning step comprises burning the laminate in air or an atmosphere having an oxygen concentration which is the same as or higher than that in air.

17. A method of manufacturing a monolithic piezoelectric ceramic device according to claim 16, wherein the conductive paste contains up to about 50% Pd.

18. A method of manufacturing a monolithic piezoelectric ceramic device according to claim 17, wherein the piezoelectric ceramic is a lead zirconate titanate.

19. A method of manufacturing a monolithic piezoelectric ceramic device according to claim 1, wherein the piezoelectric ceramic is a lead zirconate titanate.

* * * * *